US008946855B2

(12) United States Patent
Sohn

(10) Patent No.: US 8,946,855 B2
(45) Date of Patent: Feb. 3, 2015

(54) SEMICONDUCTOR DEVICE AND METHOD FOR MANUFACTURING THE SAME

(75) Inventor: Sang Ho Sohn, Icheon-si (KR)

(73) Assignee: Hynix Semiconductor Inc., Icheon (KR)

( * ) Notice: Subject to any disclaimer, the term of this patent is extended or adjusted under 35 U.S.C. 154(b) by 421 days.

(21) Appl. No.: 13/344,492

(22) Filed: Jan. 5, 2012

(65) Prior Publication Data

US 2012/0175734 A1 Jul. 12, 2012

(30) Foreign Application Priority Data

Jan. 10, 2011 (KR) ........................ 10-2011-0002353

(51) Int. Cl.
*H01L 21/02* (2006.01)
*H01L 27/108* (2006.01)

(52) U.S. Cl.
CPC ................................ *H01L 27/10855* (2013.01)
USPC ............ 257/532; 257/E21.646; 257/E27.084; 438/381

(58) Field of Classification Search
CPC ........................ H01L 21/8242; H01L 27/108
USPC ............ 257/532, E21.646, E27.084; 438/381
See application file for complete search history.

(56) References Cited

U.S. PATENT DOCUMENTS 6,229,174 B1 * 5/2001 Parekh .......................... 257/306
2012/0175734 A1 * 7/2012 Sohn ............................. 257/532

* cited by examiner

*Primary Examiner* — Elias M Ullah

(57) ABSTRACT

A semiconductor device and a method for manufacturing the same are disclosed. The semiconductor device includes adjacent storage node contact plugs having different heights, and lower-electrode bowing profiles having different heights, such that a spatial margin between the lower electrodes is assured and a bridge fail is prevented, resulting in improved device operation characteristics. The semiconductor device includes a first storage node contact plug and a second storage node contact plug formed over a semiconductor substrate, wherein the second storage node contact plug is arranged at a height different from that of the first storage node contact plug, and a lower electrode formed over the first storage node contact plug and the second storage node contact plug.

12 Claims, 5 Drawing Sheets

SEMICONDUCTOR DEVICE AND METHOD FOR MANUFACTURING THE SAME

CROSS-REFERENCE TO RELATED APPLICATION

Priority to Korean patent application No. 10-2011-0002353 filed on 10 Jan. 2011, the disclosure of which is hereby incorporated in its entirety by reference, is claimed.

BACKGROUND OF THE INVENTION

Embodiments relate to a semiconductor device and a method for manufacturing the same, and more particularly to a semiconductor device including a storage node contact plug and a method for manufacturing the same.

With the increasing integration of semiconductor devices, the semiconductor device is gradually reduced in size. Thus, the width of a capacitor serving as a memory space for storing data in a memory device such as a Dynamic Random Access Memory (DRAM) is also reduced. In a DRAM, the capacitor is configured by a dielectric film interposed between a storage node and a plate node. Storage capacity (i.e., capacitance) of the above-mentioned capacitor is proportional to a surface area of the node and a dielectric constant (permittivity) of a dielectric film, and is inversely proportional to spacing between nodes or electrodes (i.e., thickness of the dielectric film).

Therefore, in order to implement a high-capacitance capacitor, a dielectric film having high permittivity may be used, a node (electrode) surface area may be increased, and/or the distance between nodes may be reduced.

It may be difficult, however, to reduce the distance between nodes (i.e., thickness of the dielectric film). Accordingly, research for forming a high-capacitance capacitor have been intensively discussed in various ways, for example, a method for using the high-permittivity dielectric film, and a method for increasing the node surface area. A representative method for increasing the node surface area may be implemented as a method for forming a cylindrical three-dimensional (3D) structure. The higher the height of the cylindrical storage node, the larger the node surface area.

A semiconductor device including the cylindrical storage node and a method for manufacturing the same will hereinafter be described with reference to FIG. 1. Referring to FIG. 1, a first interlayer insulation film 15 is formed over the semiconductor substrate 10, which includes an active region and a device isolation film 14. The first interlayer insulation film 15 is etched so that a landing plug contact hole exposing the active region is formed. Thereafter, a conductive material is buried in the landing plug contact hole so that a landing plug contact 16 is formed. Then, a second interlayer insulation film 18 and a first etch stop film 23 are formed over the landing plug contact 16 and the first interlayer insulation film 15. Subsequently, the first etch stop film 23 and the second interlayer insulation film 18 are etched so that a first contact hole exposing the landing plug contact 16 is formed and a first plug 20 is formed by burying the first contact hole.

After a third interlayer insulation film 25 and a second etch stop film 30 are formed over the first plug 20 and the first etch stop film 23, the second etch stop film 30 and the third interlayer insulation film 25 are etched so that a second contact hole exposing the first plug 20 is formed. Thereafter, a conductive material is buried in the second contact hole so that a second plug 35 is formed. In this case, the first plug 20 and the second plug 35 are used as a storage node contact 38.

Thereafter, a first sacrificial film and a second sacrificial film are formed over the storage node contact 38 and the second etch stop film 30. In this case, the first sacrificial film is a Phosphorus Silicate Glass (PSG) film, and the second sacrificial film is a Plasma Enhanced Tetra Ethyle Ortho Silicate (PE-TEOS). Subsequently, the storage node contact 38 is exposed by etching the second sacrificial film and the first sacrificial film, and a first sacrificial film pattern 45a and a second sacrificial film pattern 50a for defining the storage node region 55 are formed. In this case, the PSG film serving as the first sacrificial film is rapidly etched so that a bowing profile occurs in a sidewall of a storage node region 55. Provided that a lower electrode 63 coupled to the storage node contact 38 is formed in the storage node region 55 including the bowing profile, a spatial margin between the lower electrodes 63 becomes insufficient due to the bowing profile, so that a bridge fail occurs, resulting in deterioration of semiconductor device characteristics.

BRIEF SUMMARY OF THE INVENTION

Various embodiments are directed to providing a semiconductor device and a method for manufacturing the same that substantially obviate one or more limitations of the related art.

An embodiment relates to a semiconductor device including adjacent storage node contact plugs having different heights and lower-electrode bowing profiles having different heights in such a manner that a spatial margin between the lower electrodes is assured and a bridge fail is prevented, resulting in improved device operation characteristics. Embodiments also relate to methods for forming semiconductor devices.

In particular embodiments, the bottom of a first lower electrode and the bottom of a second lower electrode are arranged at different heights in the vertical direction. Since the height of the bottom of the first lower electrode is different from that of the bottom of the second lower electrode, an adequate spatial margin can be assured at the bowing profile generation location between the first lower electrode and the second lower electrode, and the bridge fail caused by the bowing profile can be prevented from being generated between adjacent lower electrodes.

In accordance with an aspect of the present invention, a semiconductor device includes a first storage node contact plug and a second storage node contact plug formed over a semiconductor substrate, wherein the second storage node contact plug is arranged at a height different from that of the first storage node contact plug; and a first lower electrode coupled to the first storage node contact plug and a second lower electrode coupled to the second storage node contact plug each of the first storage node contact plug and the second storage node contact plug includes polysilicon.

The first storage node contact plug and the second storage node contact plug are alternately arranged.

The first and second landing plug contacts coupling the first and the second lower electrodes to first and second regions of the semiconductor substrate, respectively.

The first storage node contact plug includes a first plug having a height H1.

The second storage node contact plug includes a second plug and a third plug, the second plug has a height H1 and the third plug has a height H2, the second plug coupling the second landing plug contact to the third plug, and the third plug is formed over the second plug to couple the second plug to the second lower electrode.

The first lower electrode includes any of titanium nitride (TiN), ruthenium (Ru), ruthenium oxide (RuO₂), tantalum nitride (TaN), tungsten (W), tungsten nitride (WN), iridium (Ir), iridium oxide (IrO₂), platinum (Pt), and a combination thereof.

Comprising a dynamic random access memory.

The first and the second lower electrodes exhibit first and second bowing profiles, the first and the second bowing profiles are disposed with a step difference.

The first and the second lower electrodes are formed within Phosphorus Silicate Glass.

In accordance with an aspect of the present invention, forming a first storage node contact plug and a second storage node contact plug over a semiconductor substrate, wherein the second storage node contact plug is arranged at a height different from that of the first storage node contact plug; and forming a first lower electrode coupled to the first storage node contact plug and a second lower electrode coupled to the second storage node contact plug.

The first storage node contact plug and the second storage node contact plug are alternately arranged.

Forming first and second landing plug contacts coupling the first and the second lower electrodes to first and second regions of the semiconductor substrate, respectively.

Forming a first plug with a height H1 to be coupled with the first landing plug contact.

The step of forming second storage node contact plug includes: forming a second plug with a height H1 to be coupled to the second landing plug contact; and forming a third plug over the second plug to be coupled to the second plug.

The first storage node contact plug and the second storage node contact plug includes: forming a first interlayer insulation film over the semiconductor substrate including first and second landing plug contacts, wherein the first and the second landing plug contacts are arranged in an alternative manner; patterning the first interlayer insulation film to form first and second contact holes exposing the first and the second landing plug contacts, respectively; filling the first and the second contact holes with conductive material to form first and second plugs; forming a second interlayer insulation film over the first and the second plugs and the first interlayer insulation film; etching the second interlayer insulation film to form a third contact hole exposing the second plug by; and filling the third contact hole with conductive material to form a third plug, wherein the first plug forms of the first storage node contact plug, and the second and the third plugs form of the second storage node contact plug.

After the formation of the third plug, patterning the second interlayer insulation film to form a fourth contact hole exposing the first plug.

Forming a sacrificial film over the second interlayer insulation film so as to fill the fourth contact hole; patterning the sacrificial film to form fifth and sixth contact holes exposing the first plug and the third plug, respectively; forming first and second conductive films at the inner surfaces of the fifth and the sixth contact holes to form the first and the second lower electrodes, respectively; and removing the sacrificial film.

The fifth and the sixth contact holes have bow profiles.

The sacrificial film is formed using material capable of forming a bow profile upon etching so that the fifth and the sixth contact holes have bow profiles.

The first and the second plugs have substantially the same height.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

Figure 1:
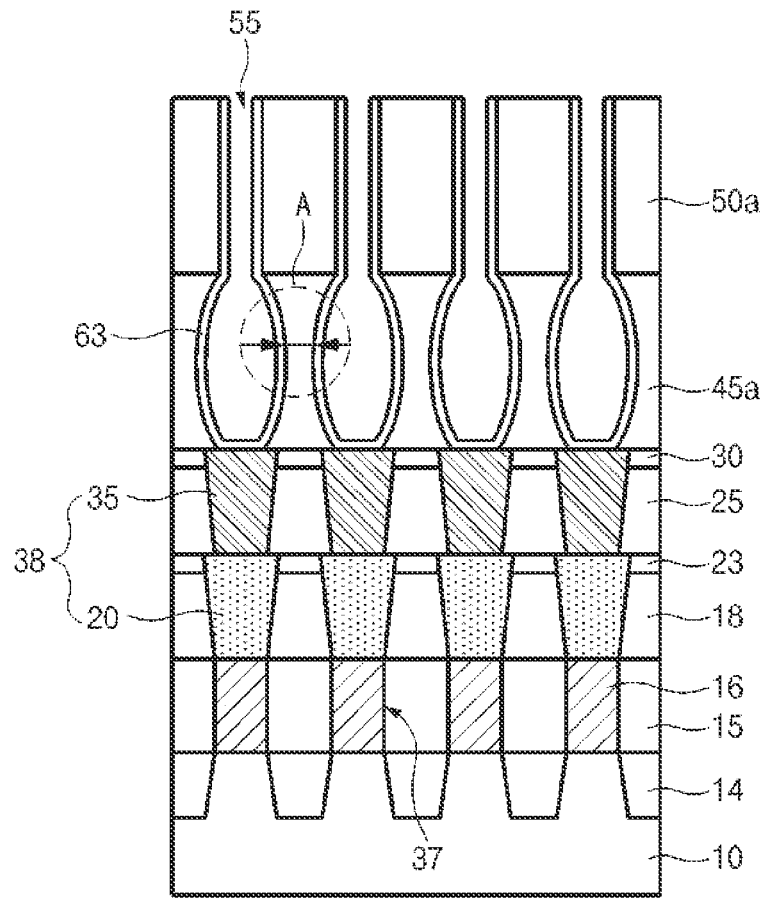
FIG. 1 is a cross-sectional view illustrating a semiconductor device and a method for manufacturing the same according to the related art.
Figure 2:
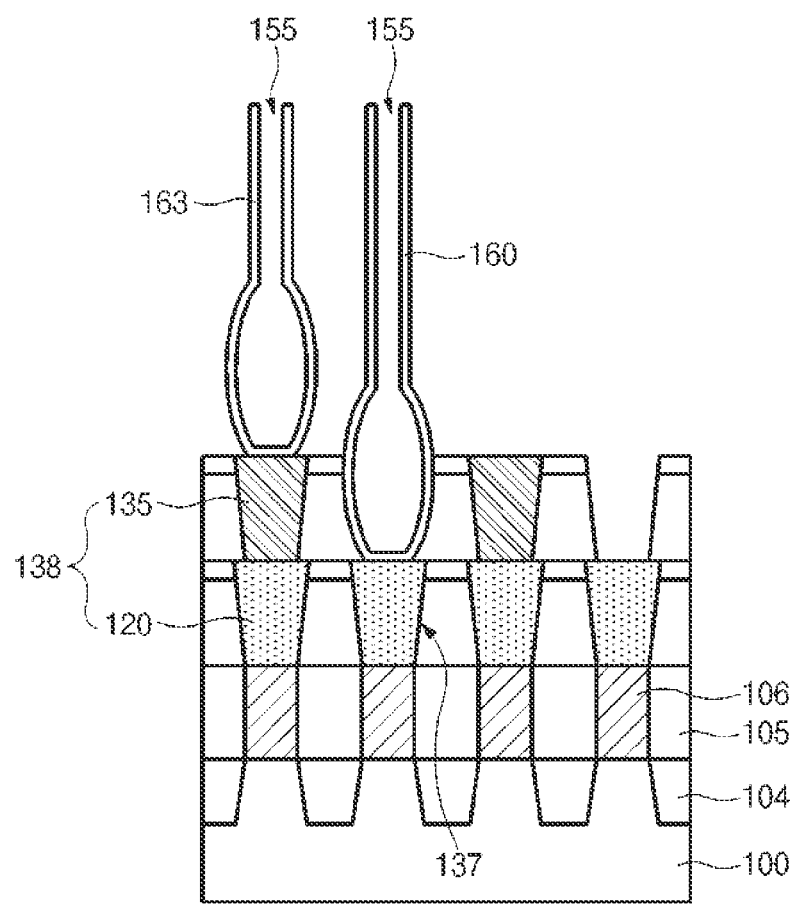
FIG. 2 is a cross-sectional view illustrating a semiconductor device and a method for manufacturing the same according to an embodiment.

FIG. 2 is a cross-sectional view illustrating a semiconductor device and a method for manufacturing the same according to embodiments of the present invention.

Referring to FIG. 2, a gate (not shown) and a landing plug contact 106 are formed in a first interlayer insulation film 105 formed over a semiconductor substrate 100 which includes an active region and a device isolation film 104. The gate (not shown) may include a gate polysilicon layer, a gate metal layer, and a gate hard mask layer. In addition, a first storage node contact plug 137 and a second storage node contact plug 138 coupled to the landing plug contact 106 are formed over the landing plug contact 106. Preferably, the first storage node contact plug 137 and the second storage node contact plug 138 may be alternately arranged. In addition, the first storage node contact plug 137 may include a first plug 120, and the second storage node contact plug 138 may include a first plug 120 and a second plug 135. Therefore, the first storage node contact plug 137 and the second storage node contact plug 138 may be formed to have different heights. In other words, the second storage node contact plug 138 is located higher than the first storage node contact plug 137 by the height of the second plug 135.

In addition, the first lower electrode 160 formed over the first storage node contact plug 137 and the second lower electrode 163 formed over the second storage node contact plug 138 are formed. In this case, the height of the first storage node contact plug 137 is different from that of the second storage node contact plug 138, such that the bottom parts of the first and second lower electrodes 160 and 163 respectively coupled to the first storage node contact plug 137 and the second storage node contact plug 138 are formed at different positions. In other words, the bottom part of the first lower electrode 160 is located lower than the bottom part of the second lower electrode 163, such that a bowing profile generated by formation of the first lower electrode 160 and a bowing profile generated by formation of the second lower electrode 163 are arranged at different heights in the vertical direction. Accordingly, the above-mentioned bowing profiles at different heights may prevent a bridge fail from occurring between adjacent lower electrodes.

FIGS. 3a to 3e are a cross-sectional view illustrating a semiconductor device and a method for manufacturing the same according to embodiments of the present invention. In more detail, FIGS. 3a to 3e are a cross-sectional view of the semiconductor device taken along the short-axis directional line of the active region.

Figure 3A:
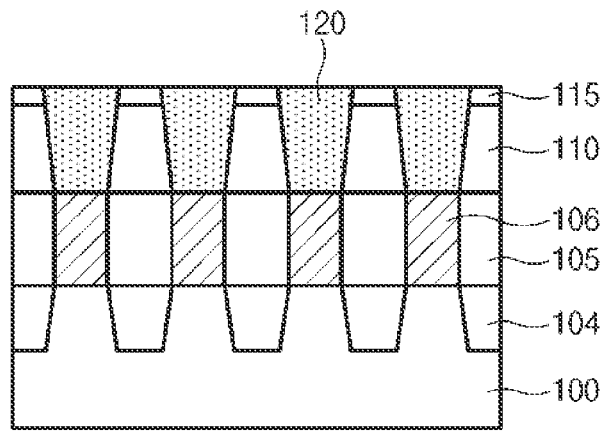
FIGS. 3a to 3e are a cross-sectional view illustrating a semiconductor device and a method for manufacturing the same according to embodiments.

Referring to FIG. 3a, a trench for device isolation is formed by etching the semiconductor substrate 100, and an insulation material is buried in the device isolation trench so that a device isolation film 104 for defining the active region is formed.

Thereafter, a gate (not shown) is formed over the semiconductor substrate 100 including the active region and the device isolation film 104. In this case, the gate (not shown) may include a gate polysilicon layer, a gate metal layer, and a gate hard mask layer. FIG. 3a is a cross-sectional view illustrating the semiconductor device taken along the short-axis directional line of the active region, so that no gate exists in FIG. 3a.

Subsequently, a first interlayer insulation film 106 is formed over the semiconductor substrate 100 including the gate (not shown), and the first interlayer insulation film 105 is etched so that a landing plug contact hole is formed.

Thereafter, after a conductive material is buried in the landing plug contact hole, the conductive material is planarized until an upper part of the gate (not shown) is exposed, so that the landing plug contact 106 is formed. Preferably, the conductive material may include polysilicon. Subsequently, a second interlayer insulation film 110 and a first etch stop film 115 are formed over the landing plug contact 106 and the first interlayer insulation film 105. The second interlayer insulation film 110 may include an oxide film, and the first etch stop film 115 may include a nitride film.

The first etch stop film 115 and the second interlayer insulation film 110 are etched so that a first contact hole exposing the landing plug contact 106 is formed. Subsequently, after a conductive material is deposited over the first etch stop film 115 including the first contact hole, the conductive material is planarized until the etch stop film 115 is exposed, so that the first plug 120 is formed. Preferably, the conductive material buried in the first contact hole may include polysilicon.

Figure 3B:
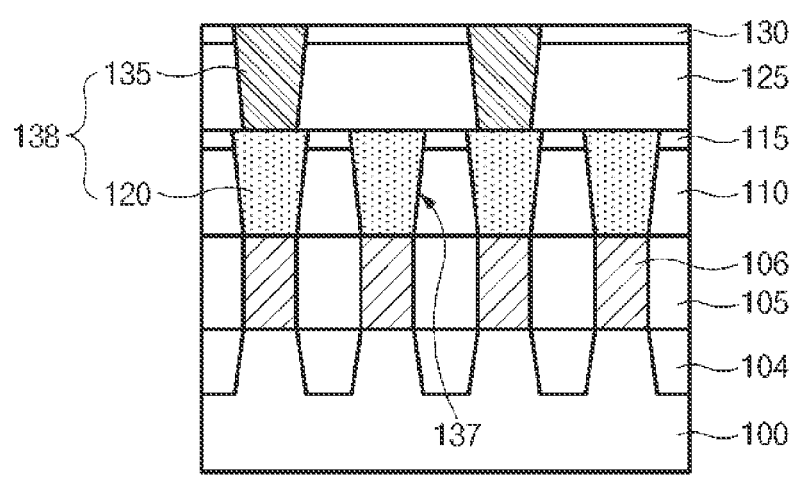

Referring to FIG. 3b, a third interlayer insulation film 125 and a second etch stop film 130 are formed over the first plug 120 and the first etch stop film 115.

Subsequently, the second etch stop film 130 and the third interlayer insulation film 125 are etched so that a second contact hole exposing the first plug 120 is formed. Preferably, the second contact hole may be formed in a manner that the first plug 120 is alternately exposed. That is, in case of forming the second contact hole exposing the first plug 120, it is preferable that a second contact hole is not formed over the first plug 120 adjacent to the exposed first plug 120.

Subsequently, a conductive material is buried in the second contact hole so that a second plug 135 is formed. Preferably, the conductive material may include a polysilicon layer.

Figure 3C:
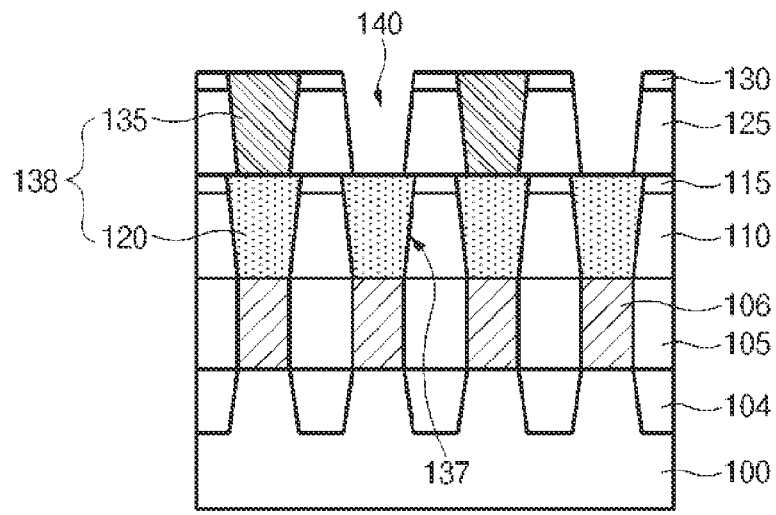

Referring to FIG. 3c, the second etch stop film 130 and the third interlayer insulation film 125 arranged among the second plugs 135 are etched, so that a third contact hole 140 is formed to expose the first plug 120 unexposed in FIG. 3b. In this case, the third contact hole 140 is formed between the second plugs 135, and the first plug 120 is alternately exposed in the same manner as in FIG. 3b. In this case, the first plug 120 exposed by the third contact hole 140 is defined as a first storage node contact plug 137, and a laminated structure of the first plug 120 and the second plug 135 is defined as a second storage node contact plug 138. The second storage node contact plug 138 may be located higher than the first storage node contact plug 137 by the height of the second plug 135.

Figure 3D:
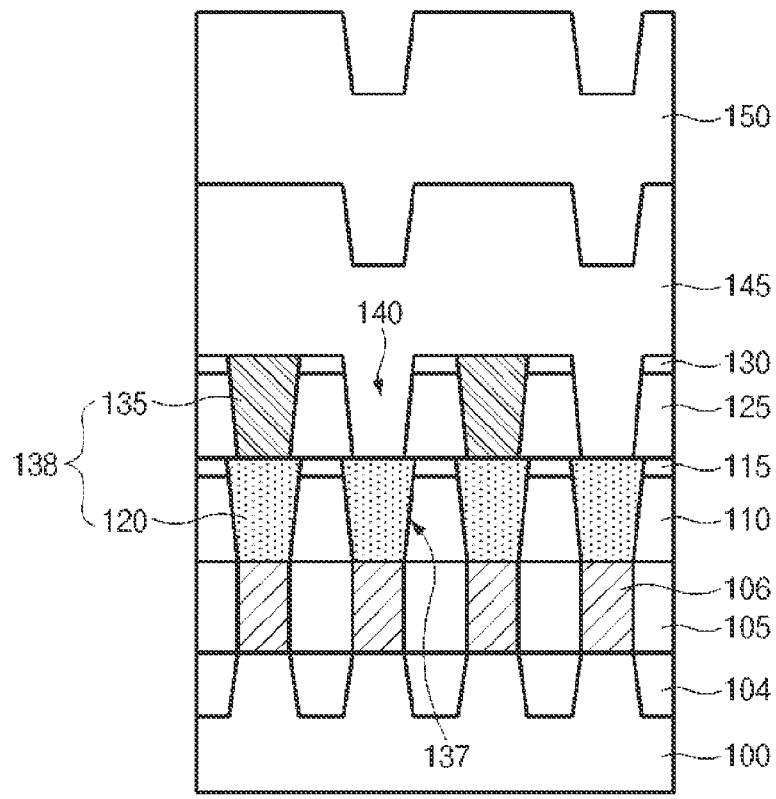

Referring to FIG. 3d, a first sacrificial film 145 is formed over the second storage node contact plug 137 and the second etch stop film 130 that include the third contact hole 140. In this case, the first sacrificial film 145 is also formed to have a step difference due to the step difference between the first storage node contact plug 137 and the second storage node contact plug 138. In addition, a second sacrificial film 150 is formed over the first sacrificial film 145 along the step difference of the first sacrificial film 145. That is, the step difference between the first sacrificial film 145 and the second sacrificial film 150 may correspond to the height of the second storage node contact plug 135. In this case, each of the first sacrificial film 145 and the second sacrificial film 150 may be formed to have a predetermined height through which a sufficient amount of capacitance of the capacitor is guaranteed. The first and second sacrificial films 145 and 150 may include any one of a PSG film, a PE-TEOS film, and a combination thereof. Preferably, the first sacrificial film 145 may be formed of a PSG film, and the second sacrificial film 150 may be formed of a PE-TEOS film.

Figure 3E:
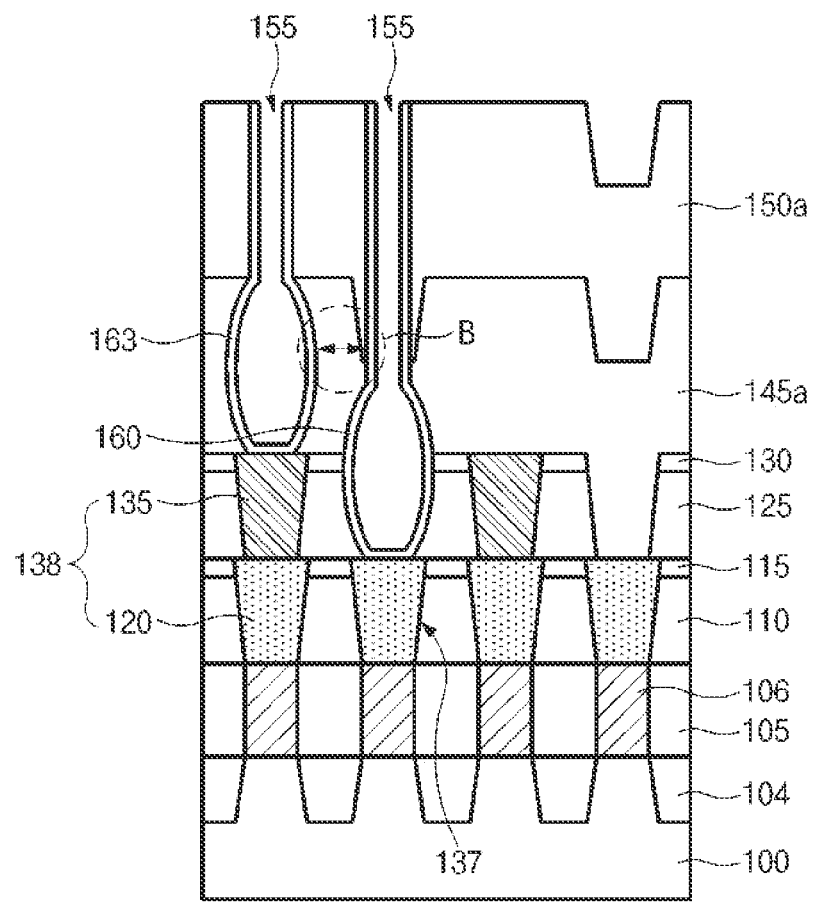

Referring to FIG. 3e, a mask pattern (not shown) defining a storage node region is formed over the second sacrificial film 150. Subsequently, the second sacrificial film 150 and the first sacrificial film 145 are etched using a mask pattern (not shown) as an etch mask, so that a second sacrificial film pattern 150a and a first sacrificial film pattern 145a are formed to define a storage node region. In this case, the second sacrificial film pattern 150a and the first sacrificial film 145a are formed to expose the first storage node contact plug 137 and the second storage node contact plug 138. In this case, although there arises a bowing profile in which a sidewall of a storage node region 155 is convexly etched due to a high etch rate of the first sacrificial film pattern 145a, a step difference corresponding to the height of the second plug 135 of the first sacrificial film pattern 145a is generated in the first sacrificial film 145a, such that bowing profile generation parts are located at different heights.

Thereafter, a conductive material for use in the lower electrode is deposited over the entire surface including the second sacrificial film pattern 150a and the first sacrificial film pattern 145a. The conductive material for the lower electrode is formed through a Chemical Vapor Deposition (CVD) or Atomic Layer Deposition (ALD) process.

The conductive material in the lower electrode may be formed of any one of a titanium nitride (TiN) film, a ruthenium (Ru) film, a ruthenium oxide ($RuO_2$) film, a tantalum nitride (TaN) film, a tungsten (W) film, a tungsten nitride (WN), an iridium (Ir) film, an iridium oxide ($IrO_2$) film, a platinum (Pt) film, and a combination thereof.

After that, a planarization process is carried out until the top part of the sacrificial film pattern (not shown) is exposed, such that a first lower electrode 160 and a second lower electrode 163 are formed to be separated from each other. In this case, the first lower electrode 160 is formed over the first storage node contact plug 137, and the second lower electrode 163 is formed over the second storage node contact plug 138. In other words, the bottom of the first lower electrode 160 and the bottom of the second lower electrode 163 are arranged at different heights in the vertical direction. Since the height of the bottom of the first lower electrode 160 is different from that of the bottom of the second lower electrode 163, an adequate spatial margin can be assured at the bowing profile generation location (See 'B' of FIG. 3e) between the first lower electrode 160 and the second lower electrode 163, and the bridge fail caused by the bowing profile can be prevented from being generated between adjacent lower electrodes.

As apparent from the above description, the semiconductor device according to the embodiments of the present invention includes adjacent storage node contact plugs having different heights and lower-electrode bowing profiles having different heights in such a manner that a spatial margin between the lower electrodes is assured and a bridge fail is prevented, resulting in improved device operation characteristics.

The above embodiment is illustrative and not limitative. For example, the invention is not limited to any specific type of semiconductor device. Examples of semiconductor devices include but are not limited to DRAM, static random access memory (SRAM), resistive random access memory (ReRAM), phase change random access memory (PRAM), and spin transfer torque random access memory (STT-RAM).

Various alternatives and equivalents are possible. The invention is not limited by the embodiment described herein. Other additions, subtractions, or modifications are obvious in view of the present disclosure and are intended to fall within the scope of the appended claims.

What is claimed is:

1. A semiconductor device comprising:
    a first storage node contact plug and a second storage node contact plug disposed over a semiconductor substrate, wherein the second storage node contact plug is arranged at a height different from that of the first storage node contact plug;
    a first lower electrode coupled to the first storage node contact plug, the first lower electrode being included in a first capacitor; and
    a second lower electrode coupled to the second storage node contact plug, the second lower electrode being included in a second capacitor,
    wherein a bottom surface of the first lower electrode is disposed lower than a bottom surface of the second lower electrode.

2. The semiconductor device according to claim 1, wherein each of the first storage node contact plug and the second storage node contact plug includes polysilicon.

3. The semiconductor device according to claim 1, wherein the first storage node contact plug and the second storage node contact plug are alternately arranged.

4. The semiconductor device according to claim 1, the device further comprising first and second landing plug contacts coupling the first and the second lower electrodes to first and second regions of the semiconductor substrate, respectively.

5. The semiconductor device according to claim 4, wherein the first storage node contact plug consists of a first plug having a height H1, and
    wherein the first plug is directly coupled to the first lower electrode.

6. The semiconductor device according to claim 4, wherein the second storage node contact plug includes a second plug and a third plug,
    wherein the second plug has a height H1 and the third plug has a height H2,
    wherein the second plug couples the second landing plug contact to the third plug, and
    wherein the third plug is disposed over the second plug to couple the second plug to the second lower electrode.

7. The semiconductor device according to claim 1, wherein the first lower electrode includes any of titanium nitride (TiN), ruthenium (Ru), ruthenium oxide (RuO2), tantalum nitride (TaN), tungsten (W), tungsten nitride (WN), iridium (Ir), iridium oxide (IrO2), platinum (Pt), and a combination thereof.

8. The semiconductor device according to claim 1 comprising a dynamic random access memory.

9. The semiconductor device according to claim 1, wherein the first and the second lower electrodes exhibit first and second bowing profiles,
    wherein the first and the second bowing profiles are disposed with a step difference.

10. The semiconductor device according to claim 1, wherein the first and the second lower electrodes are formed within Phosphorus Silicate Glass.

11. A semiconductor device comprising:
    a first lower storage electrode having a first bowed profile at a sidewall and coupled to a first storage node contact plug, the first lower storage electrode being included in a first capacitor; and
    a second lower storage electrode having a second bowed profile at a sidewall and coupled to a second storage node contact plug, the second lower storage electrode being included in a second capacitor,
    wherein the first bowed profile and the second bowed profile are disposed at different levels from each other, and
    wherein a bottom surface of the first lower storage electrode is disposed at a lower level than a bottom surface of the second lower storage electrode.

12. The semiconductor device of claim 11, wherein the first and the second storage electrodes are arranged in an alternative manner.

* * * * *